United States Patent
Park et al.

(10) Patent No.: US 8,275,002 B2
(45) Date of Patent: Sep. 25, 2012

(54) BROADCASTING SERVICE TRANSMITTING APPARATUS AND METHOD AND BROADCASTING SERVICE RECEIVING APPARATUS AND METHOD FOR EFFECTIVELY ACCESSING BROADCASTING SERVICE

(75) Inventors: Sung-il Park, Suwon-si (KR); Ga-hyun Ryu, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 714 days.

(21) Appl. No.: 12/120,534

(22) Filed: May 14, 2008

(65) Prior Publication Data
US 2008/0285556 A1 Nov. 20, 2008

Related U.S. Application Data

(60) Provisional application No. 60/917,776, filed on May 14, 2007, provisional application No. 60/974,321, filed on Sep. 21, 2007.

(30) Foreign Application Priority Data

Jul. 31, 2007 (KR) .................. 10-2007-0077165
Dec. 3, 2007 (KR) .................. 10-2007-0124371

(51) Int. Cl.
*H04J 3/06* (2006.01)
*H04H 20/71* (2008.01)
*H04L 12/28* (2006.01)
*H04L 12/56* (2006.01)
*H04J 3/26* (2006.01)

(52) U.S. Cl. ........ 370/510; 370/312; 370/389; 370/390; 370/432

(58) Field of Classification Search .................. None
See application file for complete search history.

(56) References Cited

U.S. PATENT DOCUMENTS
5,400,401 A 3/1995 Wasilewski et al.
(Continued)

FOREIGN PATENT DOCUMENTS
CN 1671191 A 9/2005
(Continued)

OTHER PUBLICATIONS
Korean Office Action issued on Jan. 14, 2011 in the corresponding Korean Patent Application No. 10-2009-0097026.
(Continued)

*Primary Examiner* — Ayaz Sheikh
*Assistant Examiner* — Sori Aga
(74) *Attorney, Agent, or Firm* — Sughrue Mion, PLLC

(57) ABSTRACT

A broadcasting service transmitting apparatus and method and a broadcasting service receiving apparatus and method for providing a broadcasting service formed of various types of data are provided. The broadcasting service receiving apparatus includes a receiving unit, a transport frame processing unit, a transport packet processing unit, and a broadcasting data processing unit. The receiving unit receives a transport frame having a predetermined size. The transport frame processing unit acquires from the transport frame service access information for accessing at least one broadcasting service and also acquires from the transport frame at least one transport packet for transporting at least one broadcasting data packet, by using the service access information. The transport packet processing unit processes the at least one transport packet so as to acquire at least one broadcasting data packet from the at least one transport packet. The broadcasting data processing unit processes the at least one broadcasting data packet.

44 Claims, 13 Drawing Sheets

U.S. PATENT DOCUMENTS

| | | | |
|---|---|---|---|
| 6,215,530 | B1 | 4/2001 | Wasilewski |
| 6,483,547 | B1* | 11/2002 | Eyer .......................... 348/473 |
| 6,782,553 | B1* | 8/2004 | Ogawa et al. ................ 725/146 |
| 2002/0146038 | A1 | 10/2002 | Casavant et al. |
| 2004/0103430 | A1 | 5/2004 | Lee et al. |
| 2005/0232136 | A1 | 10/2005 | Kwak |
| 2006/0246836 | A1 | 11/2006 | Simon |
| 2008/0222504 | A1* | 9/2008 | Chitturi ....................... 715/201 |
| 2008/0271077 | A1* | 10/2008 | Kim et al. ...................... 725/39 |
| 2008/0320528 | A1* | 12/2008 | Kim et al. ...................... 725/62 |
| 2009/0214043 | A1 | 8/2009 | Choi et al. |
| 2009/0269041 | A1* | 10/2009 | De Haan ...................... 386/126 |
| 2010/0322355 | A1* | 12/2010 | Vare et al. .................... 375/340 |

FOREIGN PATENT DOCUMENTS

| | | | |
|---|---|---|---|
| CN | 1929614 A | 3/2007 | |
| JP | 2000069454 A | 3/2000 | |
| JP | 2007-006349 A | 1/2007 | |
| KR | 10-2004-0036447 A | 4/2004 | |
| KR | 2004-0058502 A | 7/2004 | |
| KR | 2004-0062893 A | 7/2004 | |
| KR | 10-0565098 B1 | 3/2006 | |
| KR | 2006-0059877 A | 6/2006 | |
| KR | 10-2009-0090809 A | 8/2009 | |

OTHER PUBLICATIONS

Korean Office Action issued in corresponding Korean Application No. 10-2011-7016426 on Jul. 29, 2011.

Mexican Office Action issued in corresponding Application No. MX/a/2009/004942 on Jun. 2, 2011.

Setlur, et al., "A Mobile Open Rich Media Environment", ICME. 2006.26.26.12, Jul. 9, 2006, pp. 2029-2032.

Communication from the Canadian Patent Office in counterpart application No. 2,667,571 issued Apr. 4, 2011.

Communication from the Canadian Patent Office in counterpart application No. 2,666,573 issued Apr. 18, 2011.

Office Action from the State Intellectual Property Office of P.R. China, dated Sep. 15, 2011, issued in corresponding Chinese Application No. 200880001062.7.

Communication dated Nov. 23, 2011 issued by the Korean Intellectual Property Office in counterpart Korean Patent Application No. 10-2009-7016241.

Communication from the Finnish Patent Office issued Mar. 8, 2012 in counterpart Finnish Application No. 20095929.

Communication dated Jul. 2, 2012 from the State Intellectual Property Office of P.R. China in counterpart Chinese application No. 200880001075.4.

Communication dated Jul. 9, 2012 from the Canadian Intellectual Property Office in counterpart Canadian application No. 2667571.

* cited by examiner

FIG. 5B

| TYPE BITMAP FIELD | VERSION NUMBER FIELD | SUB-DATA CHANNEL NUMBER FIELD (IP DATA) | SUB-DATA CHANNEL NUMBER FIELD (OBJECT DATA) | FIRST CHANNEL POINTER FIELD | SECOND CHANNEL POINTER FIELD | THIRD CHANNEL POINTER FIELD | FOURTH CHANNEL POINTER FIELD | FIFTH CHANNEL POINTER FIELD |

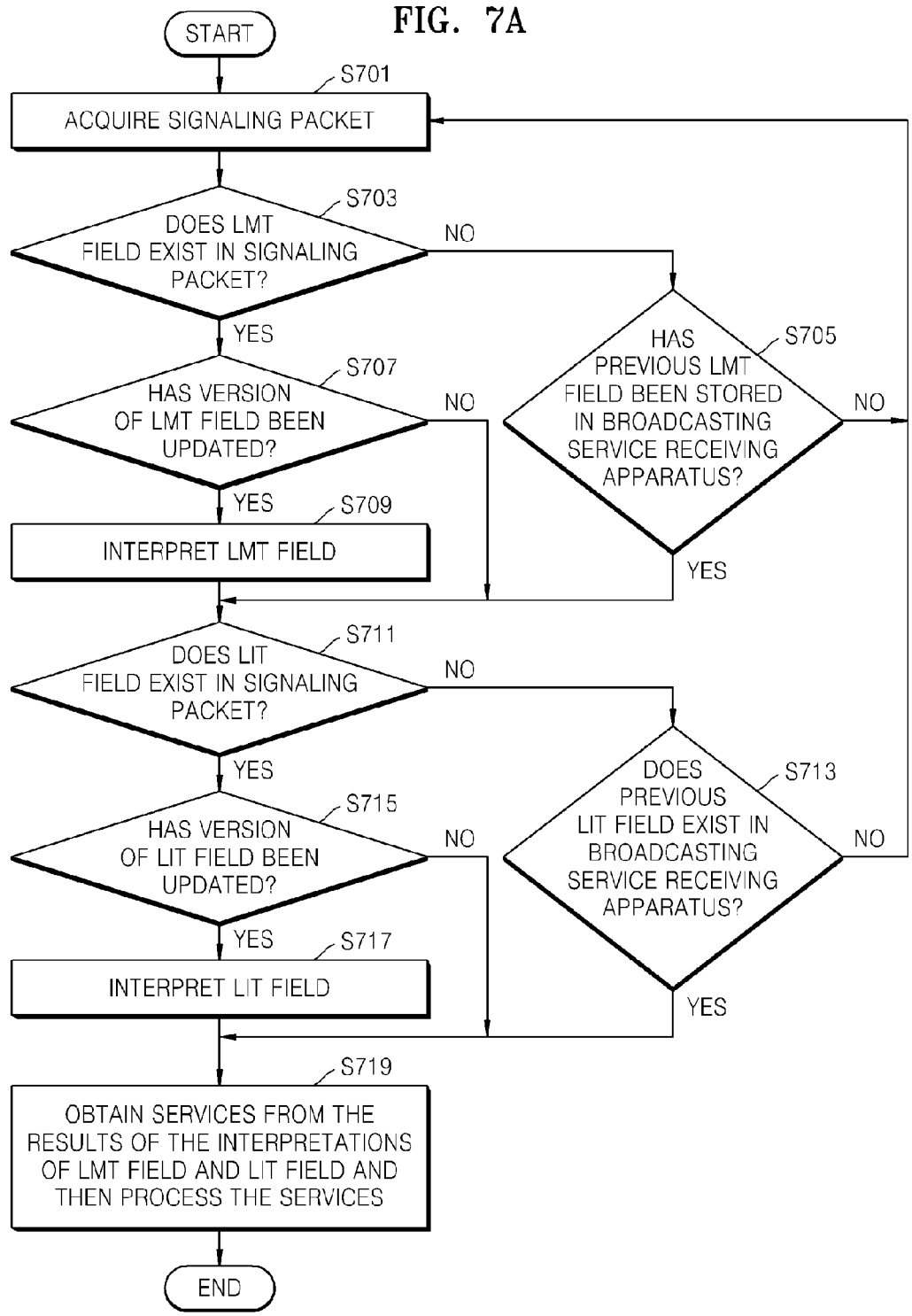

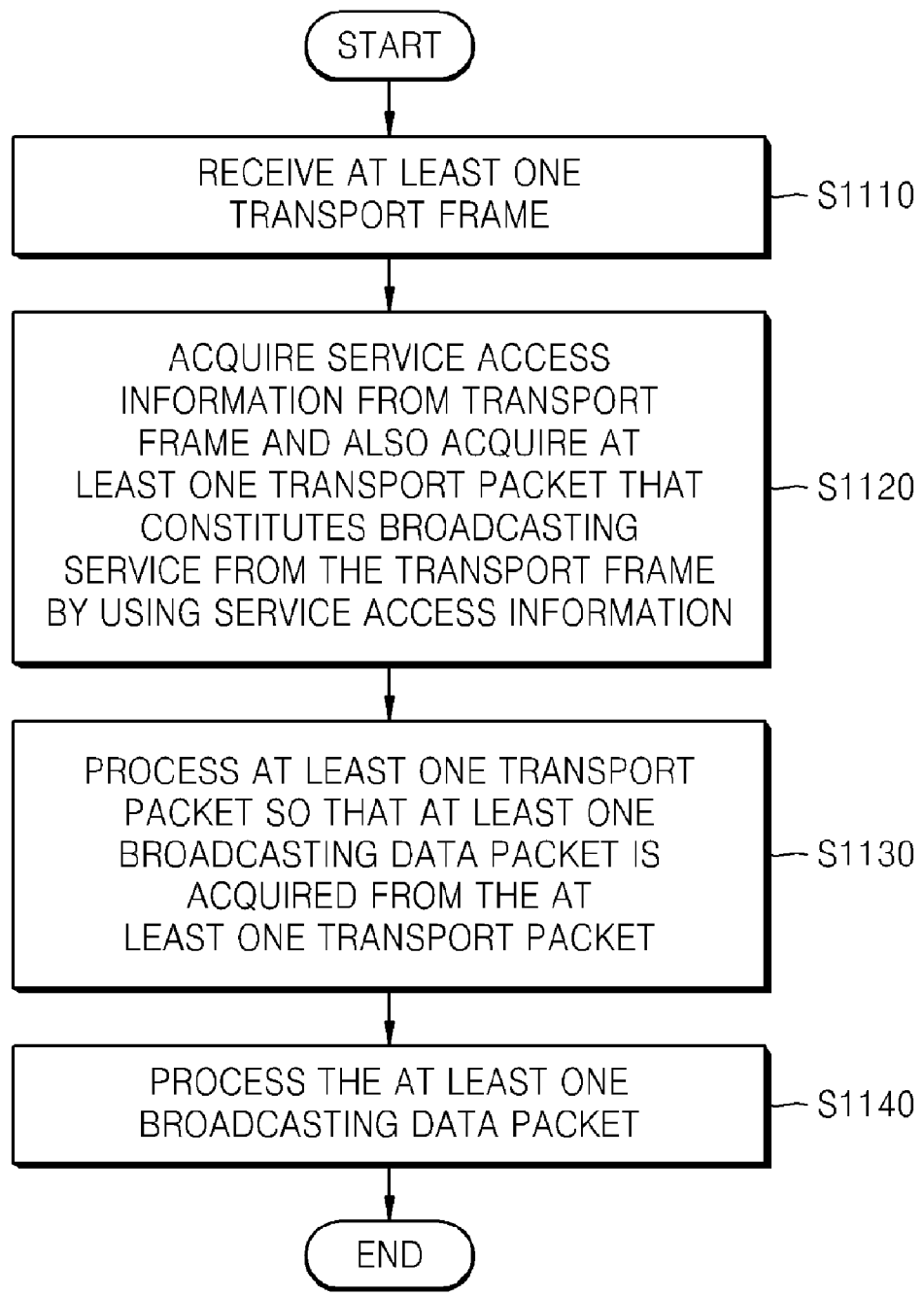

BROADCASTING SERVICE TRANSMITTING APPARATUS AND METHOD AND BROADCASTING SERVICE RECEIVING APPARATUS AND METHOD FOR EFFECTIVELY ACCESSING BROADCASTING SERVICE

CROSS-REFERENCE TO RELATED PATENT APPLICATION

This application claims the benefits of U.S. Provisional Patent Application No. 60/917,776, filed on May 14, 2007, and U.S. Provisional Patent Application No. 60/974,321, filed on Sep. 21, 2007, in the U.S. Patent and Trademark Office, and the benefits of Korean Patent Application No. 10-2007-0077165, filed on Jul. 31, 2007, and Korean Patent Application No. 10-2007-00124371, filed on Dec. 3, 2007, in the Korean Intellectual Property Office, the disclosures of which are incorporated herein in their entirety by reference.

BACKGROUND OF THE INVENTION

1. Field of the Invention

The present invention relates to an apparatus and method for providing a broadcasting service composed of various types of data, and more particularly, to a broadcasting service transmitting apparatus and method and a broadcasting service receiving apparatus and method for enabling fast and direct access to desired services.

2. Description of the Related Art

In digital broadcasting, when several service channel signals are multiplexed and transmitted via a single transmission path, the service channel signals are first individually compressed and transformed into packets, and the packets are then multiplexed into a transport stream. An identical packet identifier (PID) is allocated to packets corresponding to a single channel so that the packets can be distinguished from packets corresponding to other channels. As such, when packets having different specific IDs allocated according to the types of channels are transmitted in the form of a transport stream, a receiver selects only packets of a desired channel from the transport stream by referring to the IDs of the packets in the desired channel and demultiplexes the selected packets.

FIG. 1 is a flowchart illustrating a related art method of processing a transport stream generated using packet identifiers (PIDs).

A related art receiver processes a transport stream according to the method illustrated in FIG. 1. In operation S110, an encoded transport stream including packets is received. In operation S120, Reed-Solomon (RS) decoding is performed on the packets of the transport stream. In operation S130, the packets of the transport stream are filtered according to the PIDs. In operation S140, the packets of the transport stream are depacketized in each of layers, namely, a transport layer, a packetizing layer, and a stream layer. In operation S150, data obtained by the depacketizing is decoded.

In the related art method, the packets of the transport stream can be clearly distinguished from one another by using the PIDs. However, the packets of the transport stream should have PIDs, and the related art receiver should perform RS decoding with respect to each of the packets of the transport stream and perform filtering by individually checking the PIDs.

FIG. 2 illustrates a related art transport stream generated using PIDs. Referring to FIG. 2, a transport stream packet transporting audio/video (A/V) data, a transport stream packet transporting Internet protocol (IP) data, and a transport stream packet transporting object data are transported via a single channel. When the related art transport stream is processed, even if users want to receive only an A/V service, all of the transport stream packets should undergo Router/RS decoding and filtering by the individual check of the PIDs. Therefore, when a related art receiver processes data, temporal and spatial resources are wasted.

SUMMARY OF THE INVENTION

The present invention provides a broadcasting service transmitting apparatus and method and a broadcasting service receiving apparatus and method for enabling efficient data processing due to fast and direct access to desired services.

According to an aspect of the present invention, there is provided a broadcasting service transmitting apparatus comprising: a broadcasting data packetization unit packetizing at least one type of broadcasting data so as to generate at least one broadcasting data packet; a transport packet generation unit generating at least one transport packet for transporting the at least one broadcasting data packet; a transport frame generation unit generating a transport frame having a predetermined size for transporting at least one broadcasting service that is constructed with the at least one transport packet; and a transmission unit transmitting the transport frame, wherein the transport frame generation unit generates the transport frame so that service access information for accessing the at least one broadcasting service transported via the transport frame is included in the transport frame.

The service access information may be located in a predetermined area of the transport frame.

The service access information may comprise location information about next service access information.

The transport frame may comprise at least one virtual data channel that is distinguished according to the types of data. Each of the at least one virtual data channel may comprise at least one sub-data channel that comprises the at least one transport packet.

The service access information may comprise a location map table (LMT) comprising information indicating a physical location of sub-data channels corresponding to service components that constitute the at least one broadcasting service included in the transport frame, and a linkage information table (LIT) comprising information about the configuration of the at least one broadcasting service included in the transport frame.

The LMT may comprise type information indicating types of data transmitted via the transport frame, version information indicating the version of the LMT, sub-data channel number information indicating the number of sub-data channels corresponding to each data type, and channel pointer information indicating the locations of the sub-data channels.

The LMT may further comprise at least one piece of identical version LMT number information indicating the number of LMTs having the same version as the LMT, LMT pointer information indicating a location of a next LMT, additional data number information indicating the number of pieces of additional data associated with the at least one broadcasting service, and additional data pointer information indicating the locations of the additional data.

The LIT may comprise service number information indicating the number of broadcasting services that are transmitted via the transport frame, version information indicating the version of the LIT, and service information indicating a configuration of the broadcasting services.

The service information may comprise LMT index numbers which are allocated to the channel pointer information indicating the locations of the sub-data channels.

The transmission unit may generate and transmit an ATSC frame into which at least one transport frame described above is inserted.

According to another aspect of the present invention, there is provided a broadcasting service transmitting method comprising the operations of: packetizing at least one type of broadcasting data so as to generate at least one broadcasting data packet; generating at least one transport packet for transporting the at least one broadcasting data packet; generating a transport frame having a predetermined size for transporting at least one broadcasting service that is constructed with the at least one transport packet; and transmitting the transport frame, wherein the transport frame is generated so as to include service access information for accessing the at least one broadcasting service transported via the transport frame.

According to another aspect of the present invention, there is provided a broadcasting service receiving apparatus comprising: a receiving unit receiving a transport frame having a predetermined size; a transport frame processing unit acquiring from the transport frame service access information for accessing at least one broadcasting service and also acquiring from the transport frame at least one transport packet for transporting at least one broadcasting data packet, by using the service access information; a transport packet processing unit processing the at least one transport packet so as to acquire the at least one broadcasting data packet from the at least one transport packet; and a broadcasting data processing unit processing the at least one broadcasting data packet.

According to another aspect of the present invention, there is provided a broadcasting service receiving method comprising the operations of: receiving a transport frame having a predetermined size; acquiring from the transport frame service access information for accessing at least one broadcasting service and also acquiring from the transport frame at least one transport packet for transporting at least one broadcasting data packet, by using the service access information; processing the at least one transport packet so as to acquire at least one broadcasting data packet from the at least one transport packet; and processing the at least one broadcasting data packet.

According to the present invention, in contrast with a method of providing a service constructed by filtering packets by using packet identifiers (PIDs), direct access to each of the service components included in a service is possible.

In addition, according to the present invention, an operation of performing RS decoding on all RS-encoded transport packets and checking all of the PIDs of the transport packets is not needed when selecting service components that constitute a service. Thus, the waste of system resources due to accesses to unnecessary transport packets can be prevented.

Furthermore, according to the present invention, when locations of a LMT and a LIT within a transport frame are fixed, services and service components can be quickly accessed.

Furthermore, according to the present invention, by including information about next LMT in current LMT, services and service components can be quickly accessed even when the locations of a LMT and a LIT within a transport frame are variable.

Furthermore, according to the present invention, by including information about the number of LMTs having an identical version in a current LMT, the current LMT can be restored using previous LMT even when an error is generated in the current LMT.

Moreover, according to the present invention, an error packet can be detected without needing to use an error flag, by changing the header of the error packet.

BRIEF DESCRIPTION OF THE DRAWINGS

The above and other features and advantages of the present invention will become more apparent by describing in detail exemplary embodiments thereof with reference to the attached drawings in which:

FIGS. 5A and 5B illustrate a structure of a location map table (LMT) field according to an embodiment of the present invention;

FIG. 7A is a flowchart illustrating a method of interpreting a LMT field and a LIT field, according to an embodiment of the present invention;

FIG. 11 is a flowchart illustrating a broadcasting service receiving method according to an embodiment of the present invention.

DETAILED DESCRIPTION OF EXEMPLARY EMBODIMENTS OF THE INVENTION

The present invention will now be described more fully with reference to the accompanying drawings, in which exemplary embodiments of the invention are shown.

The present invention is used in deterministic environments where broadcasting services are provided by transmitting frames having a constant size, that is, a fixed size, at regular intervals. In the specification, frames of constant size are referred to as transport frames.

Figure 3:
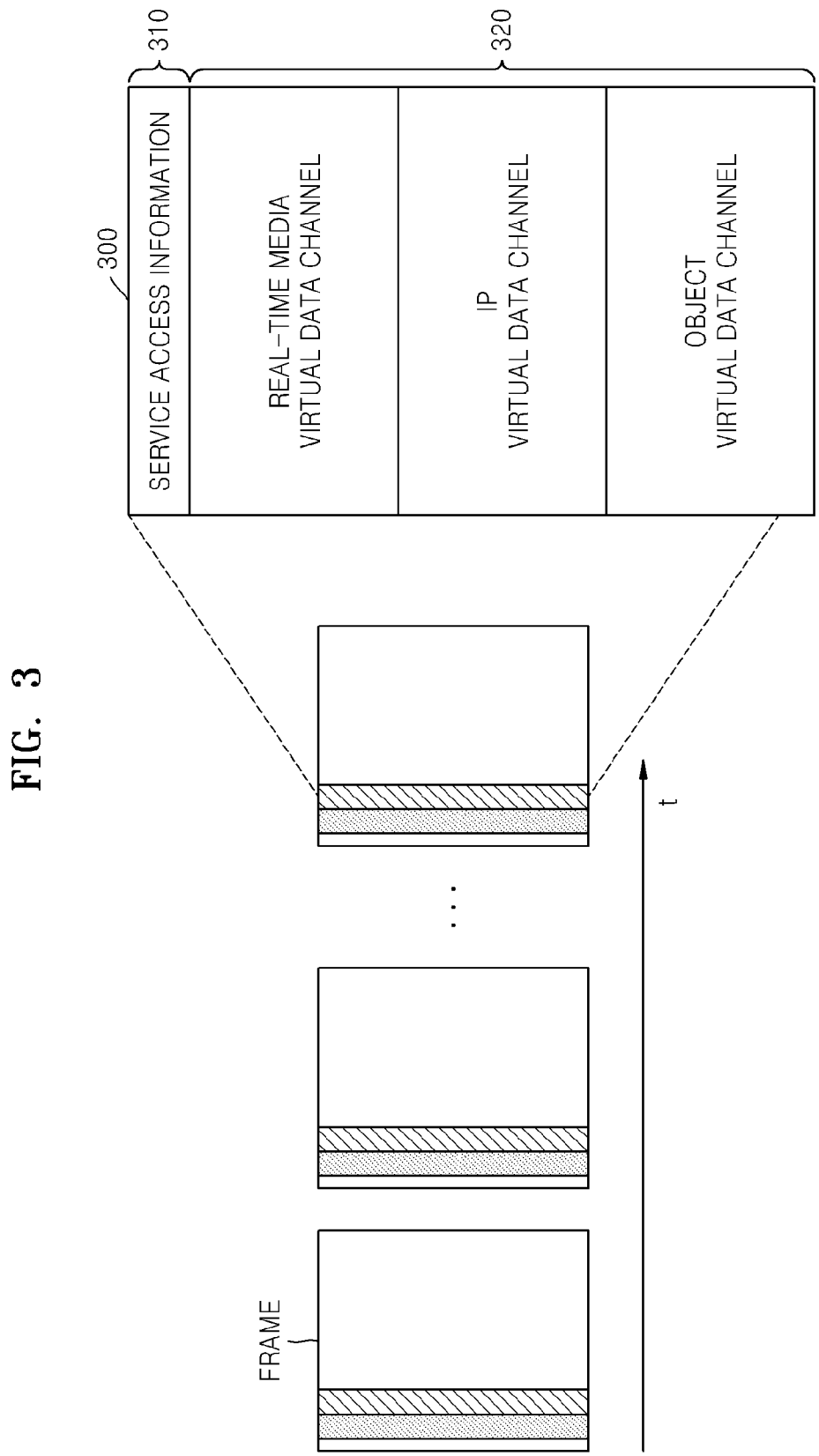
FIG. 3 illustrates a structure of a transport frame according to an embodiment of the present invention.

FIG. 3 illustrates a structure of a transport frame 300 according to an embodiment of the present invention.

Referring to FIG. 3, the transport frame 300 according to the current embodiment of the present invention includes a service information area 310 and a data area 320. As illustrated in FIG. 3, the transport frame 300 according to the current embodiment of the present invention may be inserted into and transported as a part of a transport frame of a broadcasting system other than a broadcasting system for the transport frame 300, for example, as a part of an ATSC frame of an ATSC broadcasting system. Alternatively, the transport frame 300 may be independently transported, or mapped with a transport stream of a broadcasting system other than a broadcasting system for the transport frame 300 in a one-to-one correspondence to be transported.

The data area 320 of the transport frame 300 is divided into virtual data channels that are distinguished according to the type of data. The virtual data channels denote channels into which channels for transmitting a data stream are physically classified according to the type of data. Each of the virtual data channels may be divided into independent sub-data channels. Each of the sub-data channels is composed of at least one transport packet, which is a minimum unit of a data stream packetized in a transport layer.

The service information area 310 includes service access information for accessing data that constitutes a broadcasting service, where the data is transported via the transport frame 300. The service access information may be implemented so as to be periodically located in a predetermined area of a frame as illustrated in FIG. 3. In addition, current service access information may include information about the location of next service access information so as to control a cycle in which service access information is inserted into a frame or to change a location in the frame into which service access information is inserted.

Figure 4:
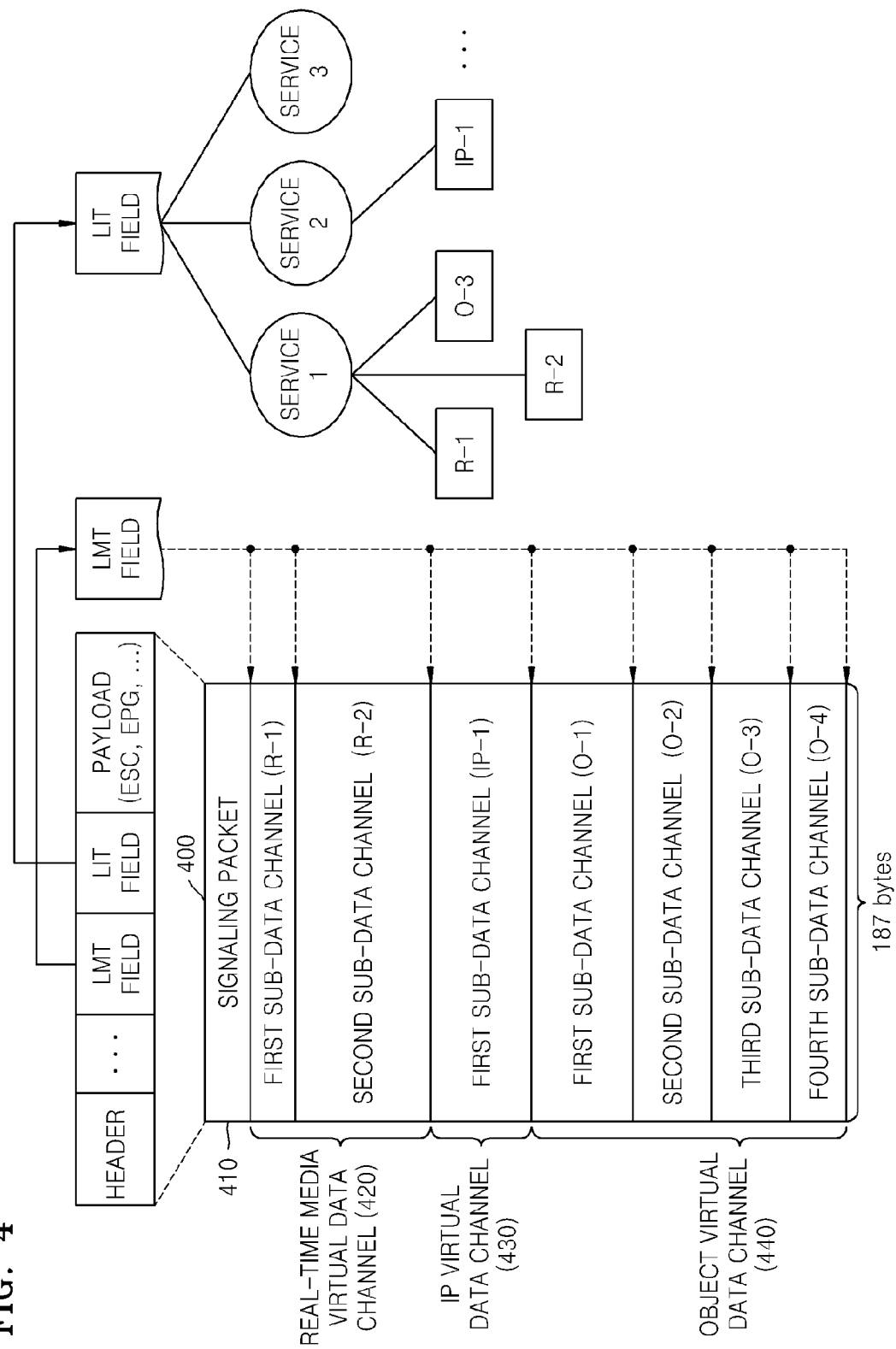
FIG. 4 illustrates the structure of the transport frame illustrated in FIG. 3, in greater detail, according to an embodiment of the present invention.

FIG. 4 illustrates the structure of the transport frame 300 in greater detail, according to an embodiment of the present invention. FIG. 4 illustrates the structure of a transport frame 400 according to an embodiment of the present invention. Referring to FIG. 4, each of the virtual data channels of the data area 320 illustrated in FIG. 3 is divided into sub-data channels, and the sub-data channels establish services. Referring to FIG. 4, the transport frame 400 according to the current embodiment includes a signaling packet 410 (or a signaling virtual data channel), a real-time media virtual data channel 420, an IP virtual data channel 430, and an object virtual data channel 440.

Each of the virtual data channels in FIG. 4 is divided into sub-data channels. The structure of the transport frame 400 illustrated in FIG. 4 is based on an assumption that real-time media data, IP data, and object data are illustrated as three data types.

Referring to FIG. 4, the real-time media virtual data channel 420 includes a first sub-data channel R-1 and a second sub-data channel R-2 both for transporting real-time media data such as an A/V stream. The IP virtual data channel 430 includes a sub-data channel IP-1 for transporting IP data. The object virtual data channel 440 includes a first sub-data channel O-1, a second sub-data channel O-2, a third sub-data channel O-3, and a fourth sub-data channel O-4, which are used to transport object data that is used in real time or after being received and stored by a broadcasting service receiving apparatus.

A single service includes at least one service component. Accordingly, in order to provide a service to a user, the broadcasting service receiving apparatus should receive service components that constitute the service. A sub-data channel is a path through which a single service component is transported. Thus, in order to access a certain service, the broadcasting service receiving apparatus needs to know the locations of sub-data channels through which the service components that constitute the service are transported.

Service access information for accessing service components that constitute a service is included in the signaling packet 410 of FIG. 4 corresponding to the service information area 310 of FIG. 3. The signaling packet 410 includes the service access information described above with reference to FIG. 3. As illustrated in FIG. 4, the signaling packet 410 includes a header field, a location map table (LMT) field, a linkage information table (LIT) field, and a payload.

The LMT field provides information about the configuration and physical locations of sub-data channels within a transport frame.

The LIT field provides service configuration information, namely, how many services are transported via a transport frame and which sub-data channels each service is to be transported by. In other words, a LIT denotes information indicating which sub-data channels, the number of which is at least one, are used to constitute each service.

Referring to FIG. 4, the LIT field of the signaling packet 410 indicates that service 1, service 2, and service 3 are transported via the transport frame 400. In addition, the LIT field indicates that service 1 includes the first and second sub-data channels R-1 and R-2 of the real-time media virtual data channel 420 and the third sub-data channel O-3 of the object virtual data channel 440.

Figure 5A:
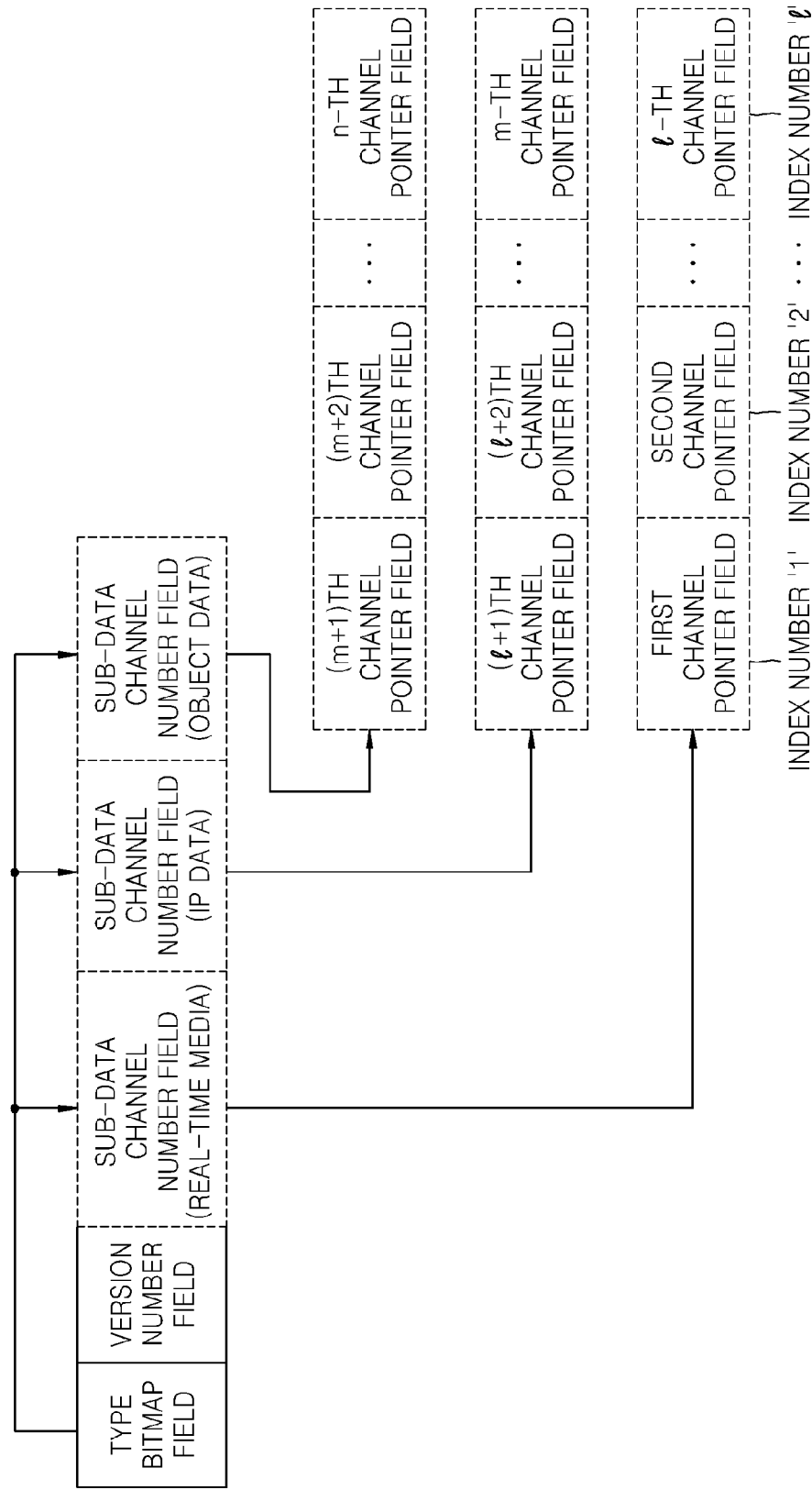

FIGS. 5A and 5B illustrate a structure of a LMT field according to an embodiment of the present invention. Referring to FIGS. 5A and 5B, the LMT field according to the current embodiment includes a type bitmap field, a version number field, and at least one sub-data channel number field.

The type bitmap field indicates which data is included in a transport frame which is transported in a predetermined cycle. It is assumed that the transport frame transports object data, audio and video (A/V) data, and IP data.

The type bitmap field is composed of 3 bits, which may indicate whether A/V data, IP data, and object data exist. For example, a bit '1' for the type bitmap field indicates existence of data corresponding to the bit, and a bit '0' for the type bitmap field indicates absence of data corresponding to the bit. Accordingly, when the type bitmap field is 111, A/V data, IP data, and object data are all included in the transport stream. Meanwhile, when the type bitmap field is 011, A/V data is not included in the transport stream, and IP data and object data are both included in the transport stream.

The version number field indicates the version number of the LMT field.

A sub-data channel number in the sub-data channel number field denotes the number of sub-data channels that belong to each type of virtual data channel. The sub-data channel number corresponds to the number of channel pointers that indicate the physical addresses of the sub-data channels that belong to each virtual data channel. Referring to FIG. 5A, channel pointer fields for real-time media data are first through l-th channel pointer fields, channel pointers for IP data are (l+1)th through m-th channel pointer fields, and channel pointers for object data are (m+1)th through n-th channel pointer fields. Here, l, m, and n denote integers equal to or greater than 0. For example, if no real-time media data is transported via a transport stream, no sub-data channel number fields for real-time media data and no channel pointer fields for real-time media data may exist.

For example, if the type bitmap field value is 100 and the at least one sub-data channel number field value is 2, two channel pointer fields that respectively indicate two channel pointers of two sub-data channels through which real-time media data is transported are included next to the sub-data channel number field.

In the LMT field, each channel pointer field includes information indicating the physical location of each sub-data channel. Index numbers may be sequentially allocated to the channel pointer fields. The index numbers sequentially allocated to the channel pointer fields of the LMT field are referred to as LMT index numbers. The LMT index numbers are not included in the channel pointer fields when the corresponding transport stream is generated, and instead a broadcasting service receiving apparatus may sequentially allocate the LMT index numbers to the channel pointer fields while interpreting the LMT field. In this case, the LMT index numbers are sequentially allocated without distinguishing the types of sub-data channels.

When the type bitmap field value is 011, the sub-data channel number field value for IP data is 2, and the sub-data channel number field value for object data is 3, the LMT field may be constructed as illustrated in FIG. 5B. In FIG. 5B, first and second channel pointer fields indicate the locations of sub-data channels for IP data, and third through fifth channel pointer fields indicate the locations of sub-data channels for object data. Here, the first through fifth channel pointers are sequentially numbered with LMT index numbers 1 through 5, respectively.

However, alternatively, LMT index numbers may be sequentially allocated to the channel point fields according to types of the virtual data channels indicated by the channel point fields. In other words, the sub-data channels may be separately numbered according to the types of sub-data channels.

In this case, the first and second channel pointer fields are respectively numbered with index number 1 and index number 2, and the third, fourth, and fifth channel pointer fields are respectively numbered with index numbers 1, 2, and 3. Thus, it is not clear whether index number 1 corresponds to either the first channel pointer field or the third channel pointer field. This problem may be addressed by further including information for use in determining whether the corresponding index number is allocated for either an IP virtual data channel or an object virtual data channel. Information indicating which type of virtual data channel an index number corresponds to will be described later with reference to FIG. 6B.

Figure 5C:
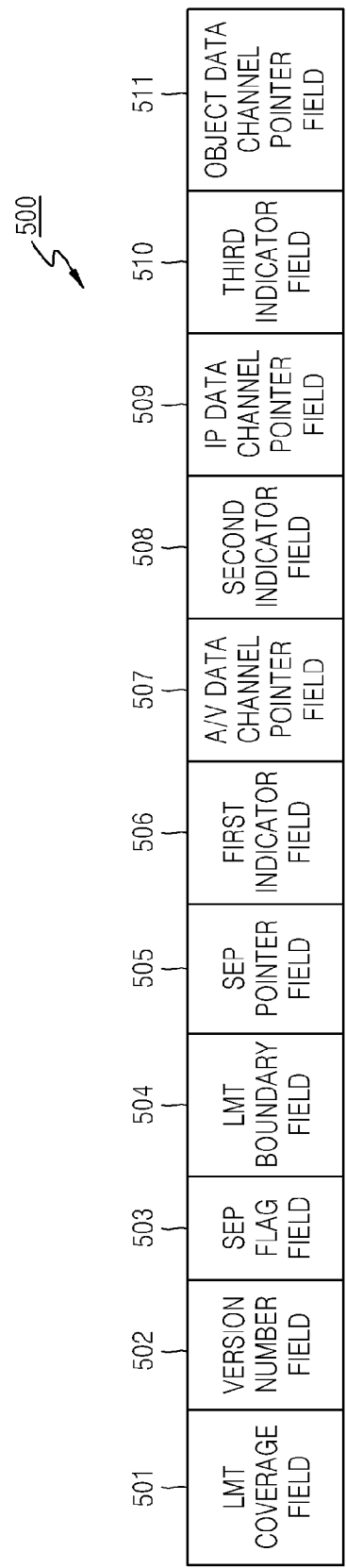
FIG. 5C illustrates a structure of a LMT field according to another embodiment of the present invention.

FIG. 5C illustrates a structure of a LMT field 500 according to another embodiment of the present invention. Referring to FIG. 5C, the LMT field 500 according to the current embodiment is divided into a LMT coverage field 501, a version number field 502, a signaling encapsulation packet (SEP) flag field 503, a LMT boundary field 504, an SEP pointer field 505, a first indicator field 506, an A/V data channel pointer field 507, a second indicator field 508, an IP data channel pointer field 509, a third indicator field 510, and an object data channel pointer field 511.

The LMT coverage field 501 indicates the number of LMT fields having the same version as that of the LMT field 500. For example, if the version of the LMT field 500 is 1 and a bit value of the LMT coverage field 501 is '00001', the number of LMT fields having the version '1' to be transmitted after the LMT 500 is 1.

The version number field 502 indicates the version of the LMT field 500.

The SEP flag field 503 indicates whether the LMT field 500 includes a signaling packet. The signaling packet may be additional data for use in transport frame processing, such as LMT or LIT, or may be additional data associated with services loaded in a transport stream, such as an electronic program guide (EPG) or an electronic service guide (ESG). When the bit value of the SEP flag field 503 is '1', the SEP pointer field 505, indicating the location of the signaling packet, exists next to the SEP flag field 503. The LMT boundary field 504 indicates the range of packets that the LMT field 500 affects. For example, the LMT boundary field 504 may indicate the address of the last packet that affects the LMT field 500, or the number of packets that affect the LMT field 500. When the LMT boundary field 504 indicates the address of the last packet that affects the LMT field 500, packets located at addresses prior to the address of the last packet are determined to be the packets that affect the LMT field 500. This means that a new LMT field exists at the address next to the address indicated by the LMT boundary field 504. Accordingly, the use of the LMT boundary field 504 enables the location of the next LMT field to be easily predicted.

The SEP pointer field 505 indicates the location of the signaling packet.

The first indicator field 506 indicates whether a sub-data channel exists. When the value of the first indicator field 506 is '1', a channel pointer exists next to the first indicator field 506. Referring to FIG. 5C, the first indicator field 506 indicates existence of an A/V sub-data channel.

The A/V data channel pointer field 507 indicates the location of the A/V sub-data channel.

The second indicator field 508 indicates whether an additional sub-data channel exists. When the value of the second indicator field 508 is '1', a channel pointer exists next to the second indicator field 508. Referring to FIG. 5C, the second indicator field 508 indicates existence of an IP sub-data channel.

The IP data channel pointer field 509 indicates the location of the IP sub-data channel.

The third indicator field 510 indicates whether an additional sub-data channel exists, similar to the second indicator 508. When the value of the third indicator field 510 is '1', a channel pointer exists next to the third indicator field 510. Referring to FIG. 5C, the third indicator field 510 indicates existence of an object sub-data channel.

The object data channel pointer field 511 indicates the location of the object sub-data channel.

The broadcasting service receiving apparatus can know the number of sub-data channels by using the first, second, and third indicators 506, 508, and 510, and know the locations of the sub-data channels by using the channel pointers 507, 509, and 511.

Figure 6A:
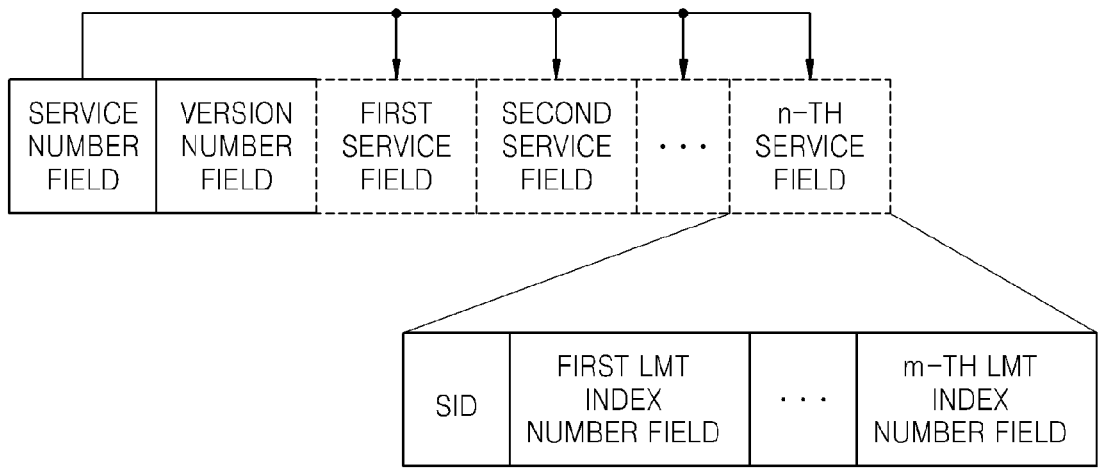
FIG. 6A illustrates a structure of a linkage information table (LIT) field according to an embodiment of the present invention.

FIG. 6A illustrates a structure of a LIT field according to an embodiment of the present invention. Referring to FIG. 6A, the LIT field according to the current embodiment includes a service number field, a version number field, and at least one service field indicating at least one service.

The service number field indicates the number of services included in a single transport frame according to the present invention.

The version number field indicates the version of the LIT field.

Each of the service fields includes a service identifier field (SID) and at least one LMT index number field. As in the above-described structure of the LIT field, the at least one LMT index number field indicates at least one number allocated to at least one channel pointer. Accordingly, the broadcasting service receiving apparatus can know the physical addresses of sub-data channels corresponding to a desired service from a transport frame, by interpreting the LIT field.

For example, suppose that the broadcasting service receiving apparatus interprets a signaling packet of a received transport stream, in which a LMT field is as illustrated in FIG. 5B, an n-th service field shown in FIG. 6A includes a first LMT index number field and a second LMT index number field, and the values of the first and second LMT index number fields are 2 and 5, respectively. In this case, the broadcasting service receiving apparatus interprets the n-th service as a service, the service including data included in a sub-data channel having the physical location indicated by the second channel pointer field shown in FIG. 5B and data included in a sub-data channel having the physical location indicated by the fifth channel pointer field shown in FIG. 5B. Accordingly, when the n-th service is desired, the broadcasting service receiving apparatus does not process all of the transport packets included in the transport stream, and instead processes only the data transported via transport packets included in sub-data channels at the physical locations indicated by the second and fifth channel pointer fields, thereby rapidly and efficiently processing broadcasting data.

Figure 6B:
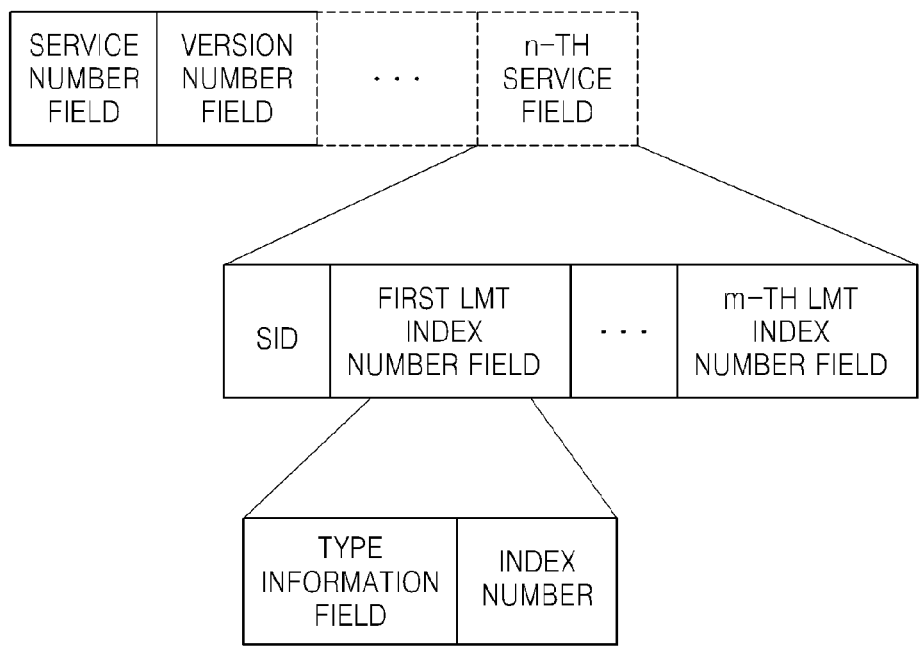
FIG. 6B illustrates a structure of a LIT field according to another embodiment of the present invention.

FIG. 6B illustrates a structure of a LIT field according to another embodiment of the present invention. Referring to FIG. 6B, the LIT field according to the current embodiment includes a service number field, a version number field, and at least one service field indicating at least one service.

Each of the service fields includes an SID and at least one channel information field.

For example, suppose that the LMT field of a transport stream is as illustrated in FIG. 5B and sequential LMT index numbers are independently allocated to the channel pointer fields according to types of sub-data channels indicated by the channel pointer fields. In other words, the sub-data channels are independently numbered with index numbers according to the types of data. In addition, suppose that an n-th service shown in FIG. 6B includes two sub-data channels. Accordingly, the n-th service field of FIG. 6B includes a first channel information field and a second channel information field.

In this case, the first and second channel pointer fields, corresponding to sub-data channels for IP data, shown in FIG. 5B are respectively numbered with index number 1 and index number 2, and the third, fourth, and fifth channel pointer fields, corresponding to sub-data channels for object data, shown in FIG. 5B are respectively numbered with index numbers 1, 2, and 3.

Each of the channel information fields includes a type information field and a LMT index number field.

The type information field is composed of 2 bits and indicates the type of sub-data channel corresponding to a LMT index number. A data value '01' of the type information field may indicate that the sub-data channel corresponding to a LMT index number is a sub-data channel for IP data. On the other hand, a data value '10' of the type information field may indicate that the sub-data channel corresponding to a LMT index number is a sub-data channel for object data.

The LMT index number field is composed of 5 bits.

When the value of the first channel information field is '0100010', 2 upper bits indicate an IP virtual sub-data channel and 5 lower bits indicate a channel pointer having an LMT index number 2. Accordingly, it can be known that the n-th service includes the data included in the sub-data channel at the physical location indicated by the second channel pointer field.

When the value of the second channel information field is '1000011', 2 upper bits indicate an object virtual sub-data channel and 5 lower bits indicate a channel pointer having an LMT index number 3. Accordingly, it can be known that the n-th service also includes the data included in the sub-data channel at the physical location indicated by the fifth channel pointer field.

Consequently, when the n-th service is desired, the broadcasting service receiving apparatus does not process all of the transport packets included in the transport stream, and instead processes only the data transported via transport packets included in sub-data channels at the physical locations indicated by the second and fifth channel pointer fields, thereby rapidly and efficiently processing broadcasting data.

FIG. 7A is a flowchart illustrating a method of interpreting a LMT field and a LIT field in a broadcasting service receiving apparatus, according to an embodiment of the present invention. The LMT field is transmitted at regular intervals and located in a predetermined area of a transport frame.

Referring to FIG. 7A, in operation S701, when the broadcasting service receiving apparatus receives a transport frame, it acquires and interprets a signaling packet including service access information, which is located in a predetermined area of the transport frame.

In operation S703, the broadcasting service receiving apparatus determines whether a LMT field exists in the signaling packet. If it is determined in operation S703 that no LMT fields exist in the signaling packet, it is determined whether a previous LMT field has been stored in the broadcasting service receiving apparatus, in operation S705. If it is determined in operation S705 that a previous LMT field exists in the broadcasting service receiving apparatus, the method proceeds to operation S711.

If it is determined in operation S703 that a LMT field exists in the signaling packet, the broadcasting service receiving apparatus determines according to version information included in the LMT field whether the version of the LMT field has been updated, in operation S707. If it is determined in operation S707 that the version of the LMT field has been updated, the LMT field is interpreted in operation S709. By interpreting the LMT field in operation S709, information about the locations of sub-data channels is obtained.

In operation S711, the broadcasting service receiving apparatus determines whether a LIT field exists in the signaling packet. If it is determined in operation S711 that no LIT fields exist in the signaling packet, it is determined whether a previous LIT field exists in the broadcasting service receiving apparatus, in operation S713. If it is determined in operation S713 that a previous LIT field exists in the broadcasting service receiving apparatus, the method proceeds to operation S719.

If it is determined in operation S711 that the LIT field exists in the signaling packet, the broadcasting service receiving apparatus determines according to version information included in the LIT field whether the version of the LIT field has been updated, in operation S715. If it is determined in operation S715 that the version of the LIT field has been updated, the LIT field is interpreted in operation S717. By interpreting the LIT field in operation S717, linkage information about each service, that is, service configuration information, is obtained.

In operation S719, services are obtained from the results of the interpretations of the LMT field and LIT field, and then processed.

Figure 7B:
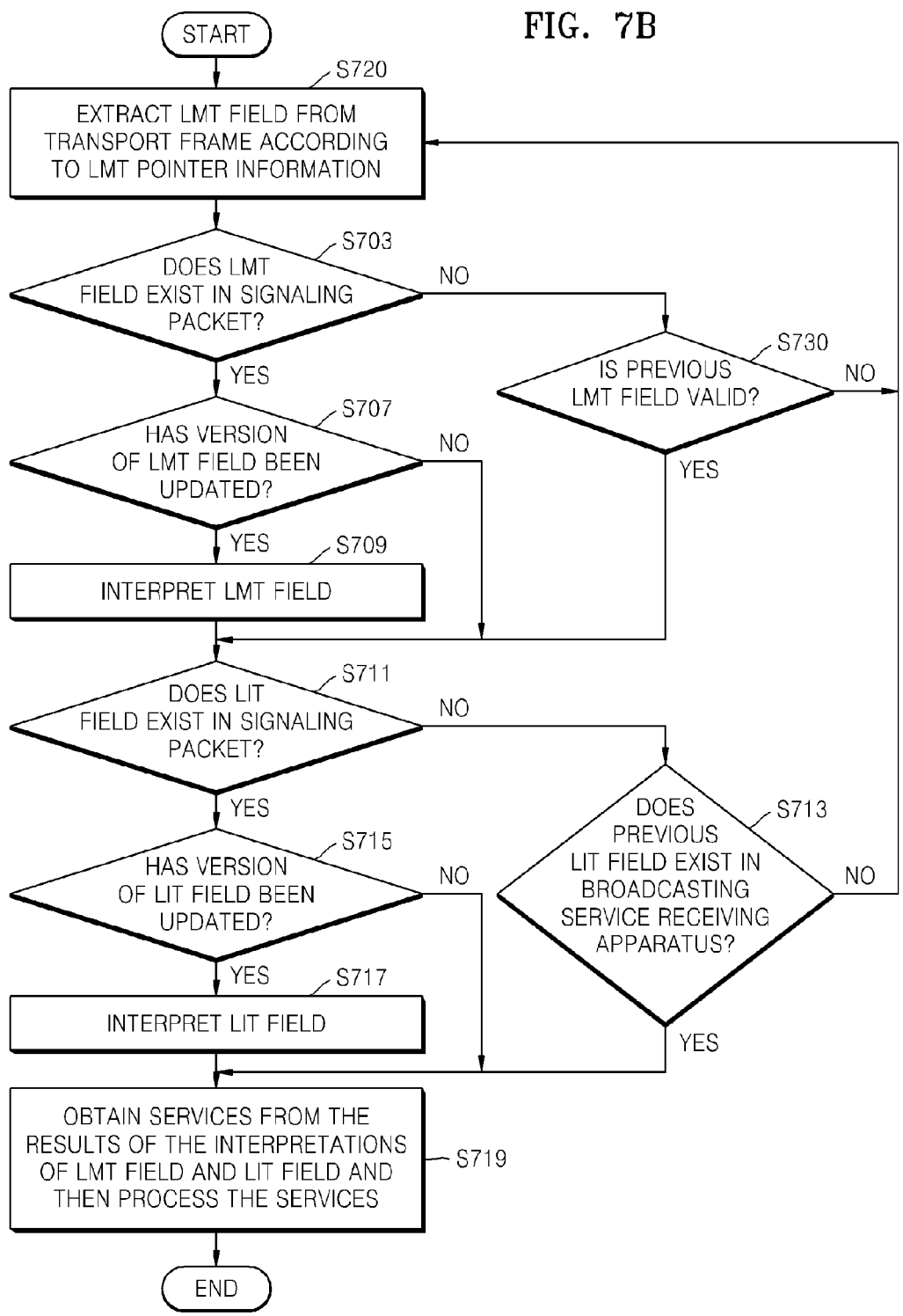
FIG. 7B is a flowchart illustrating a method of interpreting a LMT field and a LIT field, according to another embodiment of the present invention.

FIG. 7B is a flowchart illustrating a method of interpreting a LMT field and a LIT field, according to another embodiment of the present invention. In FIG. 7B, the location of the LMT field and a cycle in which the LMT field is inserted into a transport frame vary. Operations in FIG. 7B indicated by the same reference numbers as those in FIG. 7A are the same operations as those in FIG. 7A, and thus detailed descriptions thereof will be omitted.

Referring to FIG. 7B, in operation S720, a LMT field is extracted from a transport frame according to LMT pointer information extracted from a previous LMT field. The LMT pointer information points out the location of the next LMT field. Accordingly, even when the LMT field fails to be inserted into a predetermined area of the transport frame, the LMT field can be easily extracted from the transport frame.

In operation S703, the broadcasting service receiving apparatus determines whether a LMT field exists at a location indicated by the LMT pointer information. If it is determined in operation 703 that a LMT field exists in the location indicated by the LMT pointer information, the method proceeds to operation S707. On the other hand, if it is determined in operation 703 that a LMT field does not exist in the location indicated by the LMT pointer information, the method proceeds to operation S730. Where no LMT field exists in the location indicated by the LMT pointer information implies a case where the LMT field is omitted and a case where an error is generated in the LMT field.

In operation S730, it is determined according to identical version LMT number information included in a previous LMT field whether the previous LMT field is valid. The fact that the previous LMT field is valid means that the previous LMT field can be continuously used. If it is determined in operation S730 that the previous LMT field is valid, the method proceeds to operation S711.

In the specification, the identical version LMT number information denotes the number of LMT fields having an identical version. For example, suppose that the previous LMT field is referred to as a first LMT field. Identical version LMT number information included in the first LMT field denotes the number of LMTs that have the same version as that of the first LMT field and are to be transported (or received) after the first LMT field. If the identical version LMT number information included in the first LMT field is '3', there are three LMTs that have the same version as that of the first LMT field. Accordingly, when the identical version LMT number information included in the first LMT field is equal to or greater than '1', the version of the LMT field included in a current frame is the same as that of the first LMT field, and thus packets included in the current frame can be processed using the first LMT field.

Figure 8:
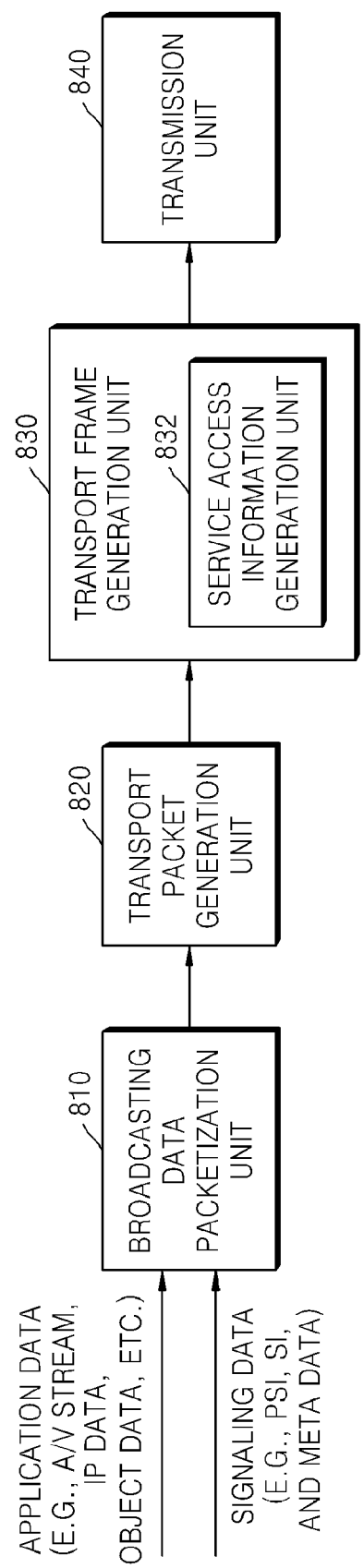
FIG. 8 is a block diagram illustrating a structure of a broadcasting service transmitting apparatus according to an embodiment of the present invention.

FIG. 8 is a block diagram illustrating a structure of a broadcasting service transmitting apparatus 800 according to an embodiment of the present invention. Referring to FIG. 8, the broadcasting service transmitting apparatus 800 according to the current embodiment includes a broadcasting data packetization unit 810, a transport packet generation unit 820, a transport frame generation unit 830, and a transmission unit 840.

The broadcasting data packetization unit 810 packetizes at least one type of broadcasting data to thereby generate at least one broadcasting data packet. The broadcasting data includes application data such as real-time media data (e.g., an A/V stream), IP data, object data, etc., and signaling data such as program specific information (PSI), service information (SI), and metadata. For example, the application data can be packetized according to an MPEG-4 system standard.

The transport packet generation unit 820 generates at least one transport packet for transporting the at least one broadcasting data packet. The transport packet may have the same size as an MPEG-2 transport stream packet. However, according to an embodiment of the present invention in which service access information is included in a predetermined area of a transport frame, inclusion of a packet identifier in a transport packet like the inclusion of a PID in an MPEG-2 transport stream packet is not needed. Similarly, according to another embodiment of the present invention in which service access information is not included in a predetermined area of a transport frame, inclusion of a packet identifier in a transport packet is not needed because the service access information includes information about the location of next service access information.

The transport frame generation unit 830 generates a transport frame having a predetermined size for transmitting the at least one broadcasting service which is constructed using the generated at least one transport packet. As illustrated in FIG. 4, the transport frame generation unit 830 forms at least one transport packet into at least one sub-data channel and generates a transport frame including the at least one sub-data channel.

The transport frame generation unit 830 generates the transport frame so that service access information for accessing the at least one broadcasting service that is transmitted via the transport frame is included in the transport frame. In order to achieve this function, the transport frame generation unit 830 may include a service access information generation unit 832 for generating the service access information.

As described above, the service access information may be transported by being included in a predetermined area of the transport frame, for example, in a first packet of the transport frame. By fixing the location of the service access information, a broadcasting service receiving apparatus can easily access the service access information included in a transport frame. However, the service access information is not necessarily included in the predetermined area of the transport frame. This is because next service access information can be easily accessed by utilizing location information about the next service access information included in current service access information.

The transport frame includes at least one virtual channel which is distinguished according to the type of data. Each of the at least one virtual channel includes at least one sub-data channel. A sub-data channel corresponds to each of at least one service component that constitutes a broadcasting service within a transport frame.

The service access information includes a LMT which indicates the location of each sub-data channel included in the transport frame, and a LIT which indicates information about the configuration of at least one broadcasting service which is transported via the transport frame.

The LMT includes type information indicating the type of data transported via the transport frame, version information indicating the version of the LMT, sub-data channel number information indicating the number of sub-data channels corresponding to each data type, and channel pointer information indicating the location of each of the sub-data channels. The LMT may further include at least one piece of identical version LMT number information indicating the number of LMTs having an identical version, LMT pointer information indicating the location of a next LMT, additional data number information indicating the number of pieces of additional data associated with at least one broadcasting service, and additional data pointer information indicating the location of each piece of additional data.

The LIT includes service number information indicating the number of broadcasting services transported via the transport frame, version information indicating the version of the LIT, and service information indicating the configuration of each of the services. The service information includes an index number allocated to the channel pointer information included in the LMT. If index numbers are sequentially allocated to the channel pointer information but independently according to the types of sub-data channels indicated by the channel pointer, the service information may include type information and index numbers, as described above. In this case, the type information indicates which type of sub-data channel a corresponding index number is associated with.

The transmission unit 840 sequentially transmits a series of transport frames which are generated by the transport frame generation unit 830, at intervals of a predetermined period. The transmission unit 840 may generate an ATSC frame in which at least one transport frame is inserted, and transmit the ATSC frame according to an ATSC system standard.

Figure 9:
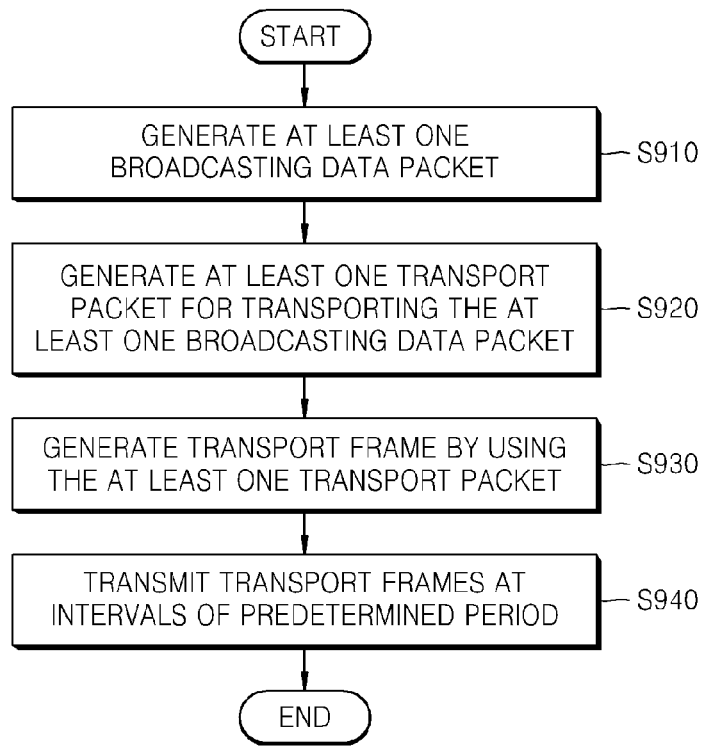
FIG. 9 is a flowchart illustrating a broadcasting service transmitting method according to an embodiment of the present invention.

FIG. 9 is a flowchart illustrating a broadcasting service transmitting method performed in the broadcasting service transmitting apparatus 800 of FIG. 8, according to an embodiment of the present invention.

Referring to FIGS. 8 and 9, in operation S910, the broadcasting data packetization unit 810 of the broadcasting service transmitting apparatus 800 packetizes at least one type of broadcasting data to thereby generate at least one broadcasting data packet.

In operation S920, the transport packet generation unit 820 generates at least one transport packet for transporting the at least one broadcasting data packet.

In operation S930, the transport frame generation unit 830 generates a transport frame having a predetermined size for transmitting at least one broadcasting service which is constructed using the generated at least one transport packet. In operation S930, the transport frame is generated so that service access information for accessing the at least one broadcasting service that is transmitted via the transport frame is included in the transport frame.

In operation S940, the transmission unit 840 transmits a series of transport frames which are generated by the transport frame generation unit 830. The transport frames may be sequentially transmitted at intervals of a predetermined period.

Figure 10:
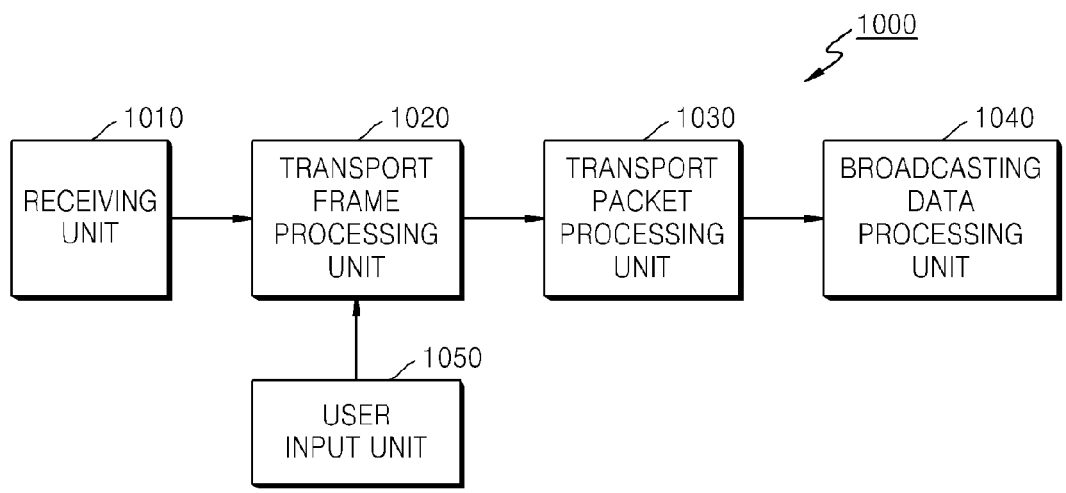
FIG. 10 is a block diagram illustrating a structure of a broadcasting service receiving apparatus according to an embodiment of the present invention.

FIG. 10 is a block diagram illustrating a structure of a broadcasting service receiving apparatus 1000 according to an embodiment of the present invention. Referring to FIG. 10, the broadcasting service receiving apparatus 1000 according to the current embodiment includes a receiving unit 1010, a transport frame processing unit 1020, a transport packet processing unit 1030, a broadcasting data processing unit 1040, and a user input unit 1050.

The receiving unit 1010 receives at least one transport frame having a predetermined size. The receiving unit 1010 may be constructed so as to receive an ATSC frame and acquire the at least one transport frame from the ATSC frame.

The transport frame processing unit 1020 acquires from the transport frame service access information for accessing at least one broadcasting service. Thereafter, the transport frame processing unit 1020 also acquires from the transport frame at least one transport packet for transporting at least one broadcasting data packet, by using the service access information. If the service access information is located in a predetermined area of the received transport frame, the transport frame processing unit 1020 acquires the service access information from the predetermined area of the received transport frame. On the other hand, if the service access information is not located in the predetermined area of the received transport frame, the transport frame processing unit 1020 acquires the service access information from the received transport frame on the basis of location information included in previous service access information. The location information included in current service access information denotes information about the location of next service access information.

More specifically, the transport frame processing unit 1020 interprets a LMT field and a LIT field which are the service access information, thereby accessing sub-data channels for each service. When one of several services transmitted via the transport frame is selected, the transport frame processing unit 1020 transmits to the transport packet processing unit 1030 transport packets included in sub-data channels that constitute the selected service.

The operation of selecting a service from the several services transmitted via the transport frame may be performed according to a user input signal received via the user input unit 1050. When a user selects a service, only the transport packets included in the sub-data channels that constitute the selected service may be transmitted to the transport packet processing unit 1030 and processed thereby. Accordingly, there is no need to perform a conventional operation of interpreting all of the PIDs included in transport packets and filtering out only transport packets having a predetermined PID.

The transport packet processing unit 1030 processes the at least one transport packet received from the transport frame processing unit 1020, thereby acquiring at least one broadcasting data packet from the at least one transport packet. The transport packet processing unit 1030 may further include a header changing unit (not shown). When an error exists in the acquired broadcasting data packet, the header changing unit changes the header value of the erroneous broadcasting data packet to a predetermined value. At this time, the header changing unit may change the header value of the erroneous broadcasting data packet to a header value that the headers of general packets cannot have. For example, the header of the erroneous broadcasting data packet may include both information indicating that the erroneous broadcasting data packet is not the first packet and information indicating that decoding information is included in the erroneous broadcasting data packet. The above-described header of the erroneous broadcasting data packet is incorrect because decoding information is supposed to be transmitted via the first packet. According to the present invention, an erroneous packet can be detected without using bits, in contrast with the conventional art in which bits are used to indicate an erroneous packet. Thus, the amount of data transmitted can be reduced.

The broadcasting data processing unit 1040 processes the at least one broadcasting data packet. The broadcasting data processing unit 1040 can be implemented as a decoder for processing broadcasting data encoded according to the MPEG-4 system standard.

FIG. 11 is a flowchart illustrating a broadcasting service receiving method according to an embodiment of the present invention.

Figure 1:
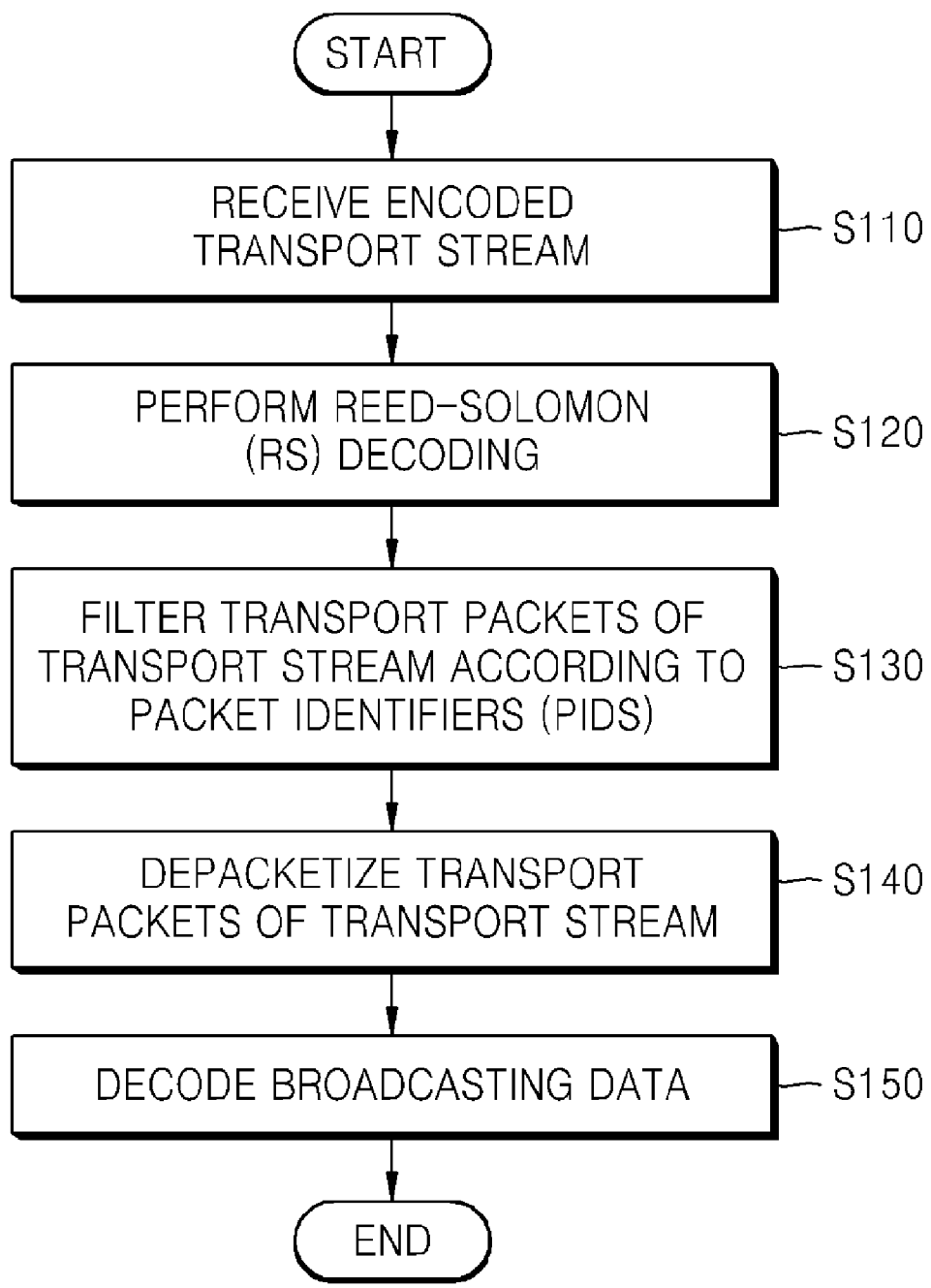
FIG. 1 is a flowchart illustrating a related art method of processing a transport stream generated using packet identifiers (PIDs)
Figure 2:
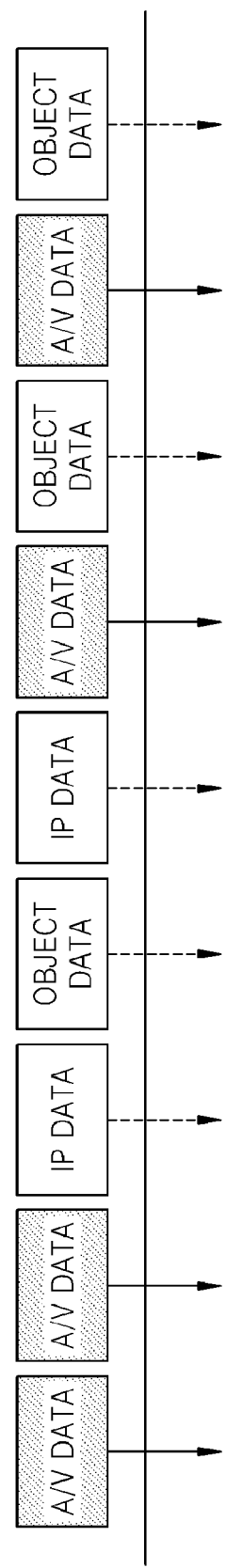
FIG. 2 illustrates a related art transport stream generated using PIDs.

Referring to FIG. 1, in operation S1110, at least one transport frame having a predetermined size is received.

In operation S1120, service access information for accessing at least one broadcasting service is acquired from the transport frame, and at least one transport packet for transporting at least one broadcasting data packet is also acquired from the transport frame by using the service access information.

In operation S1130, the at least one transport packet is processed so that at least one broadcasting data packet is acquired from the at least one transport packet.

In operation S1140, the at least one broadcasting data packet is processed.

The invention can also be embodied as computer readable codes on a computer readable recording medium. Functional programs, codes, and code segments for accomplishing the present invention can be easily construed by programmers of ordinary skill in the art to which the present invention pertains. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical discs, flash memory, and so on. The computer readable recording medium can also be distributed over network coupled computer systems so that the computer readable code is stored and executed in a distributed fashion.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A broadcasting service transmitting apparatus comprising:
    a broadcasting data packetization unit which packetizes at least one type of broadcasting data so as to generate at least one broadcasting data packet;
    a transport packet generation unit which generates at least one transport packet for transporting the at least one broadcasting data packet;
    a transport frame generation unit which generates a transport frame having a predetermined size for transporting at least one broadcasting service that is constructed with the at least one transport packet; and
    a transmission unit which transmits the transport frame,
    wherein the transport frame generation unit generates the transport frame so that service access information for accessing the at least one broadcasting service transported via the transport frame is included in the transport frame, and
    wherein the service access information comprises location information about the location of the service access information in a next transport frame.

2. The broadcasting service transmitting apparatus of claim 1, wherein the service access information is located in a predetermined area of the transport frame.

3. The broadcasting service transmitting apparatus of claim 1, wherein:
    the transport frame comprises at least one virtual data channel that is distinguished according to types of data; and
    each of the at least one virtual data channel comprises at least one sub-data channel that comprises the at least one transport packet.

4. The broadcasting service transmitting apparatus of claim 1, wherein the service access information comprises a location map table (LMT) comprising information indicating a physical location of sub-data channels corresponding to service components that constitute the at least one broadcasting service included in the transport frame, and a linkage information table (LIT) comprising information about the configuration of the at least one broadcasting service included in the transport frame.

5. The broadcasting service transmitting apparatus of claim 4, wherein the LMT comprises type information indicating types of data transmitted via the transport frame, version information indicating a version of the LMT, sub-data channel number information indicating a number of subdata channels corresponding to each data type, and channel pointer information indicating locations of the sub-data channels.

6. The broadcasting service transmitting apparatus of claim 5, wherein the LMT further comprises at least one piece of identical version LMT number information indicating a number of LMTs having the same version as the LMT, LMT pointer information indicating a location of a next LMT, additional data number information indicating the number of pieces of additional data associated with the at least one broadcasting service, and additional data pointer information indicating locations of the additional data.

7. The broadcasting service transmitting apparatus of claim 4, wherein the LIT comprises service number information indicating a number of broadcasting services that are transmitted via the transport frame, version information indicating a version of the LIT, and service information indicating a configuration of the broadcasting services.

8. The broadcasting service transmitting apparatus of claim 7, wherein the service information comprises LMT index numbers which are allocated to the channel pointer information indicating locations of the subdata channels.

9. The broadcasting service transmitting apparatus of claim 1, wherein the transmission unit generates and transmits an ATSC frame into which at least one transport frame of claim 1 is inserted.

10. A broadcasting service transmitting method comprising:
    packetizing at least one type of broadcasting data so as to generate at least one broadcasting data packet;
    generating at least one transport packet for transporting the at least one broadcasting data packet;
    generating a transport frame having a predetermined size for transporting at least one broadcasting service that is constructed with the at least one transport packet; and
    transmitting the transport frame,
    wherein the transport frame is generated so as to include service access information for accessing the at least one broadcasting service transported via the transport frame, and
    wherein the service access information comprises location information about the location of the service access information in a next transport frame.

11. The broadcasting service transmitting method of claim 10, wherein the service access information is located in a predetermined area of the transport frame.

12. The broadcasting service transmitting method of claim 10, wherein:
    the transport frame comprises at least one virtual data channel that is distinguished according to the types of data; and
    each of the at least one virtual data channel comprises at least one subdata channel that comprises the at least one transport packet.

13. The broadcasting service transmitting method of claim 10, wherein the service access information comprises a location map table (LMT) comprising information indicating a physical location of sub-data channels corresponding to service components that constitute the at least one broadcasting service included in the transport frame, and a linkage information table (LIT) comprising information about the configuration of the at least one broadcasting service included in the transport frame.

14. The broadcasting service transmitting method of claim 13, wherein the LMT comprises type information indicating types of data transmitted via the transport frame, version information indicating a version of the LMT, sub-data channel number information indicating a number of subdata channels corresponding to each data type, and channel pointer information indicating locations of the sub-data channels.

15. The broadcasting service transmitting method of claim 14, wherein the LMT further comprises at least one piece of identical version LMT number information indicating a number of LMTs having the same version as the LMT, LMT pointer information indicating a location of a next LMT, additional data number information indicating the number of pieces of additional data associated with the at least one broadcasting service, and additional data pointer information indicating locations of the additional data.

16. The broadcasting service transmitting method of claim 13, wherein the LIT comprises service number information indicating a number of broadcasting services that are transmitted via the transport frame, version information indicating a version of the LIT, and service information indicating a configuration of the broadcasting services.

17. The broadcasting service transmitting method of claim 16, wherein the service information comprises LMT index numbers which are allocated to the channel pointer information indicating locations of the subdata channels.

18. The broadcasting service transmitting method of claim 10, further comprising generating and transmitting an ATSC frame into which at least one transport frame of claim 10 is inserted.

19. A broadcasting service receiving apparatus comprising:
   a receiving unit which receives a transport frame having a predetermined size;
   a transport frame processing unit which acquires from the transport frame service access information for accessing at least one broadcasting service and also acquiring from the transport frame at least one transport packet for transporting at least one broadcasting data packet, by using the service access information;
   a transport packet processing unit which processes the at least one transport packet so as to acquire the at least one broadcasting data packet from the at least one transport packet; and
   a broadcasting data processing unit which processes the at least one broadcasting data packet,
   wherein the service access information comprises location information about the location of the service access information in a next transport frame.

20. The broadcasting service receiving apparatus of claim 19, wherein the service access information is located in a predetermined area of the transport frame.

21. The broadcasting service receiving apparatus of claim 19, wherein:
   the transport frame processing unit acquires the service access information from the transport frame on the basis of location information included in previous service access information.

22. The broadcasting service receiving apparatus of claim 19, wherein:
   the service access information comprises information about a number of pieces of service access information that have the same contents as the service access information; and
   the transport frame processing unit further comprises a service access information restoration unit for restoring the acquired service access information on the basis of previous service access information if an error exists in the acquired service access information.

23. The broadcasting service receiving apparatus of claim 19, wherein:
   the transport frame comprises at least one virtual data channel that is distinguished according to types of data; and
   each of the at least one virtual data channel comprises at least one sub-data channel that comprises the at least one transport packet.

24. The broadcasting service receiving apparatus of claim 19, wherein the service access information comprises a location map table (LMT) comprising information indicating a physical location of sub-data channels corresponding to service components that constitute the at least one broadcasting service included in the transport frame, and a linkage information table (LIT) comprising information about the configuration of the at least one broadcasting service included in the transport frame.

25. The broadcasting service receiving apparatus of claim 24, wherein the LMT comprises type information indicating types of data transmitted via the transport frame, version information indicating a version of the LMT, sub-data channel number information indicating a number of subdata channels corresponding to each data type, and channel pointer information indicating locations of the sub-data channels.

26. The broadcasting service receiving apparatus of claim 25, wherein the LMT further comprises at least one piece of identical version LMT number information indicating a number of LMTs having the same version as the LMT, LMT pointer information indicating a location of a next LMT, additional data number information indicating a number of pieces of additional data associated with the at least one broadcasting service, and additional data pointer information indicating locations of the additional data.

27. The broadcasting service receiving apparatus of claim 24, wherein the LIT comprises service number information indicating a number of broadcasting services that are transmitted via the transport frame, version information indicating a version of the LIT, and service information indicating a configuration of the broadcasting services.

28. The broadcasting service receiving apparatus of claim 27, wherein the service information comprises index numbers which are allocated to the channel pointer information indicating locations of the sub-data channels.

29. The broadcasting service receiving apparatus of claim 19, wherein the receiving unit receives an ATSC frame and acquires at least one transport frame of claim 19 from the ATSC frame.

30. The broadcasting service receiving apparatus of claim 19, wherein:
   the transport frame processing unit further comprises a header changing unit for, if an error exists in the acquired broadcasting data packet, changing a header value of the erroneous broadcasting data packet to a predetermined header value; and
   the broadcasting data processing unit does not process at least one broadcasting data packet having the predetermined header value from the at least one broadcasting data packet.

31. A broadcasting service receiving method comprising:
   receiving a transport frame having a predetermined size;
   acquiring from the transport frame service access information for accessing at least one broadcasting service and also acquiring from the transport frame at least one transport packet for transporting at least one broadcasting data packet, by using the service access information;
   processing the at least one transport packet so as to acquire at least one broadcasting data packet from the at least one transport packet; and
   processing the at least one broadcasting data packet,
   wherein the service access information comprises location information about the location of the service access information in a next transport frame.

32. The broadcasting service receiving method of claim 31, wherein the service access information is located in a predetermined area of the transport frame.

33. The broadcasting service receiving method of claim 31, wherein:
   the acquiring of the transport packet comprises acquiring the service access information from the transport frame on the basis of location information included in previous service access information.

34. The broadcasting service receiving method of claim 31, wherein:
- the service access information comprises information about a number of pieces of service access information that have the same contents as the service access information; and
- the acquiring of the transport packet further comprises restoring the acquired service access information on the basis of previous service access information if an error exists in the acquired service access information.

35. The broadcasting service receiving method of claim 31, wherein:
- the transport frame comprises at least one virtual data channel that is distinguished according to types of data; and
- each of the at least one virtual data channel comprises at least one sub-data channel that comprises the at least one transport packet.

36. The broadcasting service receiving method of claim 31, wherein the service access information comprises a location map table (LMT) comprising information indicating a physical location of sub-data channels corresponding to service components that constitute the at least one broadcasting service included in the transport frame, and a linkage information table (LIT) comprising information about the configuration of the at least one broadcasting service included in the transport frame.

37. The broadcasting service receiving method of claim 36, wherein the LMT comprises type information indicating types of data transmitted via the transport frame, version information indicating a version of the LMT, sub-data channel number information indicating a number of sub-data channels corresponding to each data type, and channel pointer information indicating locations of the sub-data channels.

38. The broadcasting service receiving method of claim 37, wherein the LMT further comprises at least one piece of identical version LMT number information indicating a number of LMTs having the same version as the LMT, LMT pointer information indicating a location of a next LMT, additional data number information indicating a number of pieces of additional data associated with the at least one broadcasting service, and additional data pointer information indicating locations of the additional data.

39. The broadcasting service receiving method of claim 36, wherein the LIT comprises service number information indicating a number of broadcasting services that are transmitted via the transport frame, version information indicating a version of the LIT, and service information indicating a configuration of the broadcasting services.

40. The broadcasting service receiving method of claim 39, wherein the service information comprises index numbers which are allocated to the channel pointer information indicating the locations of the sub-data channels.

41. The broadcasting service receiving method of claim 31, wherein the receiving of the transport frame comprises receiving an ATSC frame and acquiring at least one transport frame of claim 31 from the ATSC frame.

42. The broadcasting service receiving method of claim 31, wherein:
- the acquiring of the broadcasting data packet further comprises, if an error exists in the acquired broadcasting data packet, changing a header value of the erroneous broadcasting data packet to a predetermined header value; and
- in the processing of the broadcasting data packet, at least one broadcasting data packet having the predetermined header value from among the at least one broadcasting data packet is not processed.

43. A non-transitory computer readable recording medium having recorded thereon a program for a broadcasting service transmitting method comprising:
- packetizing at least one type of broadcasting data so as to generate at least one broadcasting data packet;
- generating at least one transport packet for transporting the at least one broadcasting data packet;
- generating a transport frame having a predetermined size for transporting at least one broadcasting service that is constructed with the at least one transport packet; and
- transmitting the transport frame,
- wherein the transport frame is generated so as to include service access information for accessing the at least one broadcasting service transported via the transport frame, and
- wherein the service access information comprises location information about the location of the service access information in a next transport frame.

44. A non-transitory computer readable recording medium having recorded thereon a program for a broadcasting service receiving method comprising:
- receiving a transport frame having a predetermined size;
- acquiring from the transport frame service access information for accessing at least one broadcasting service and also acquiring from the transport frame at least one transport packet for transporting at least one broadcasting data packet, by using the service access information;
- processing the at least one transport packet so as to acquire at least one broadcasting data packet from the at least one transport packet; and
- processing the at least one broadcasting data packet,
- wherein the service access information comprises location information about the location of the service access information in a next transport frame.

* * * * *